(12) United States Patent
Tao et al.

(10) Patent No.: US 7,279,255 B2
(45) Date of Patent: Oct. 9, 2007

(54) NEGATIVE-WORKING RADIATION-SENSITIVE COMPOSITIONS AND IMAGEABLE MATERIALS

(75) Inventors: Ting Tao, Fort Collins, CO (US); Scott A. Beckley, Windsor, CO (US)

(73) Assignee: Eastman Kodak Company, Rochester, NY (US)

( * ) Notice: Subject to any disclaimer, the term of this patent is extended or adjusted under 35 U.S.C. 154(b) by 61 days.

(21) Appl. No.: 11/349,376

(22) Filed: Feb. 7, 2006

(65) Prior Publication Data

US 2007/0184380 A1 Aug. 9, 2007

(51) Int. Cl.
*G03F 7/30* (2006.01)
*G03F 7/029* (2006.01)
*G03F 7/033* (2006.01)
*G03F 7/038* (2006.01)

(52) U.S. Cl. .............. 430/17; 430/287.1; 430/302; 430/306; 430/325; 430/914

(58) Field of Classification Search .......... 430/17, 430/287.1, 302, 306, 325, 914
See application file for complete search history.

(56) References Cited

U.S. PATENT DOCUMENTS

| 6,309,792 | B1 | 10/2001 | Hauck et al. |
| 6,352,812 | B1 | 3/2002 | Shimazu et al. |
| 6,569,603 | B2 | 5/2003 | Furukawa |
| 6,787,281 | B2 | 9/2004 | Tao et al. |
| 6,893,797 | B2 | 5/2005 | Munnelly et al. |
| 6,899,994 | B2 | 5/2005 | Huang et al. |
| 2003/0118939 | A1 | 6/2003 | Munnelly et al. |
| 2004/0043325 | A1 | 3/2004 | Shibuya et al. |

FOREIGN PATENT DOCUMENTS

| EP | 1 079 276 | 2/2001 |
| EP | 1 182 033 | 2/2002 |
| EP | 1 449 650 | 8/2004 |
| JP | 2003-330185 | 11/2003 |

*Primary Examiner*—Richard L. Schilling
(74) *Attorney, Agent, or Firm*—J. Lanny Tucker

(57) ABSTRACT

A radiation-sensitive composition includes a radically polymerizable component and a borate initiator composition capable of generating radicals sufficient to initiate polymerization of the radically polymerizable component upon exposure to imaging radiation. This composition also includes a radiation absorbing compound (such as an IR-sensitive dye), a polymeric binder comprising a polymer backbone to which is directly or indirectly linked a pendant group comprising a reactive vinyl group, and a primary additive that is a poly(alkylene glycol) or an ether or ester thereof that has a number average molecular weight of from about 200 and up to 4000 and comprises from about 2 to about 50 weight % based on the total composition solids content. This composition can be used to prepare a negative-working imageable element that can be imaged at relatively low energy and developed without a preheat step.

23 Claims, No Drawings

NEGATIVE-WORKING RADIATION-SENSITIVE COMPOSITIONS AND IMAGEABLE MATERIALS

FIELD OF THE INVENTION

This invention relates to negative-working, radiation-sensitive compositions and imageable elements such as negative-working printing lithographic printing plate precursors that can be imaged at lower energies. These imageable elements also can be developed without preheat steps. The invention also relates to methods of using these imageable elements.

BACKGROUND OF THE INVENTION

Radiation-sensitive compositions are routinely used in the preparation of imageable materials including lithographic printing plate precursors. Such compositions generally include a radiation-sensitive component, an initiator system, and a binder, each of which has been the focus of research to provide various improvements in physical properties, imaging performance, and image characteristics.

Recent developments in the field of printing plate precursors concern the use of radiation-sensitive compositions that can be imaged by means of lasers or laser diodes, and more particularly, that can be imaged and/or developed on-press. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of at least 700 nm, and thus the radiation-sensitive compositions are required to be sensitive in the near-infrared or infrared region of the electromagnetic spectrum. However, other useful radiation-sensitive compositions are designed for imaging with ultraviolet or visible radiation.

There are two possible ways of using radiation-sensitive compositions for the preparation of printing plates. For negative-working printing plates, exposed regions in the radiation-sensitive compositions are hardened and unexposed regions are washed off during development. For positive-working printing plates, the exposed regions are dissolved in a developer and the unexposed regions become an image.

Various radiation compositions and imageable elements containing reactive polymer binders are described in U.S. Pat. No. 6,569,603 (Furukawa) and EP 1,182,033A1 (Fujimaki et al.). The reactive polymer binders include reactive vinyl groups pendant to the polymer backbone. Other IR-sensitive compositions are described in U.S. Pat. Nos. 6,309,792 (Hauck et al.), 6,893,797 (Munnelly et al.), 6,787,281 (Tao et al.), and 6,899,994 (Huang et al.), U.S. Patent Application Publication 2003/0118939 (West et al.), and EP 1,079,276A1 (Lifka et al.) and EP 1,449,650A1 (Goto).

Problem to be Solved

The various radiation sensitive compositions of the art can readily be used to prepare negative-working imageable elements but they generally require the use of oxygen impermeable overcoats in order to prevent oxygen interference with radical polymerization in the imageable layers. In addition, imaging such elements generally requires the use of a preheat step to cure the imaged element prior to development in order to enhance crosslinking among binders and reactive components in the imaging layer, particularly where the elements are sensitive to and imaged by infrared radiation.

It would be desirable in the industry to have highly sensitive negative-working imageable elements that have good shelf life but that do not require the presence of a coated oxygen impermeable overcoat. It would also be desirable to avoid the use of a preheat step before development without any loss in imaging properties.

SUMMARY OF THE INVENTION

The present invention provides a radiation-sensitive composition comprising:

a radically polymerizable component, a borate initiator composition capable of generating radicals sufficient to initiate polymerization of the radically polymerizable component upon exposure to imaging radiation, a radiation absorbing compound, a polymeric binder comprising a polymer backbone to which is directly or indirectly linked a pendant group comprising a reactive vinyl group, and a primary additive that is a poly(alkylene glycol) or an ether or ester thereof that has a number average molecular weight of from about 200 and up to 4000 and comprises from about 2 to about 50 weight % of the composition based on the total composition solids content.

The invention also provides an imageable element comprising a substrate having thereon an imageable layer comprising:

a radically polymerizable component, a borate initiator composition capable of generating radicals sufficient to initiate polymerization of the radically polymerizable component upon exposure to imaging radiation, a radiation absorbing compound, a polymeric binder comprising a polymer backbone to which is directly or indirectly linked a pendant group comprising a reactive vinyl group, and a primary additive that is a poly(alkylene glycol) or an ether or ester thereof that has a number average molecular weight of from about 200 and up to 4000 and comprises from about 2 to about 50 weight % based on the total dry weight of the imageable layer.

Further, this invention provides a method of making a negative-working printing plate comprising:

A) imagewise exposing an imageable element comprising a substrate having thereon an imageable layer comprising:

a radically polymerizable component, a borate initiator composition capable of generating radicals sufficient to initiate polymerization of the radically polymerizable component upon exposure to imaging radiation, a radiation absorbing compound, a polymeric binder comprising a polymer backbone to which is directly or indirectly linked a pendant group comprising a reactive vinyl group, and a primary additive that is a poly(alkylene glycol) or an ether or ester thereof that has a number average molecular weight of from about 200 and up to 4000 and comprises from about 2 to about 50 weight % based on the total dry weight of the imageable layer, and B) without a preheat step, developing the imagewise exposed element to remove only non-exposed regions of the imageable layer.

In preferred embodiments, the imagewise exposure step A can be carried out using an exposure energy of from about 30 to about 500 mJ/cm$^2$, and where the radiation absorbing compound is carbon black or an IR-sensitive dye, the imagewise exposing step A is advantageously carried out using radiation having a maximum wavelength of from about 700 to about 1200 nm at an energy level of from about 30 to about 250 mJ/cm$^2$ and preferably less than 180 mJ/cm$^2$. The imageable elements of this invention do not need an oxygen impermeable topcoat that is used in many elements described in the art.

The present invention provides imaged elements with the noted advantages of eliminating an oxygen impermeable topcoat and avoiding preheat steps while imaging at relatively lower imaging energies (for example, up to 250 mJ/cm$^2$) and maintaining good shelf life of the product because of the incorporation of the poly(alkylene glycol) primary additive defined herein.

DETAILED DESCRIPTION OF THE INVENTION

Definitions

Unless the context indicates otherwise, when used herein, the term "radiation-sensitive composition", "imageable element", and "printing plate precursor" are meant to be references to embodiments of the present invention.

In addition, unless the context indicates otherwise, the various components described herein such as "radically polymerizable component", "borate initiator", "radiation absorbing compound", "polymeric binder", "primary additive", and similar terms also refer to mixtures of such components. Thus, the use of the article "a" is not necessarily meant to refer to only a single component.

Moreover, unless otherwise indicated, percentages refer to percents by dry weight.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311(1996). However, any definitions explicitly set forth herein should be regarded as controlling.

"Graft" polymer or copolymer refers to a polymer having a side chain that has a molecular weight of at least 200.

The term "polymer" refers to high and low molecular weight polymers including oligomers and includes homopolymers and copolymers.

The term "copolymer" refers to polymers that are derived from two or more different monomers.

The term "backbone" refers to the chain of atoms in a polymer to which a plurality of pendant groups are attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Radiation-Sensitive Compositions

One aspect of the present invention is a radiation-sensitive composition that may have any utility wherever there is a need for a coating that is polymerizable using suitable electromagnetic radiation, and particularly where it is desired to remove unexposed regions of the coated and imaged composition. The radiation-sensitive compositions can be used to prepare imageable elements such as printed circuit boards for integrated circuits, microoptical devices, paint compositions, molding compositions, color filters, and photomasks, and preferably printed forms such as lithographic printing plate precursors and imaged printing plates that are defined in more detail below.

The radically polymerizable component present in the radiation-sensitive composition contains any polymerizable group that can be polymerized using free radical initiation. For example, the radically polymerizable component can contain an addition polymerizable ethylenically unsaturated group, a crosslinkable ethylenically unsaturated group, a ring-opening polymerizable group, an azido group, an aryldiazonium salt group, an aryldiazosulfonate group, or a combination thereof. The radically polymerizable component generally does not include poly(alkylene glycol) moieties.

Suitable ethylenically unsaturated compounds that can be polymerized or crosslinked include ethylenically unsaturated polymerizable monomers that have one or more of the polymerizable groups, including unsaturated esters of alcohols, such as acrylate and methacrylate esters of polyols. Oligomers and/or prepolymers, such as urethane acrylates and methacrylates, epoxide acrylates and methacrylates, polyester acrylates and methacrylates, polyether acrylates and methacrylates, and unsaturated polyester resins can also be used. In some embodiments, the radically polymerizable component comprises carboxy groups.

Particularly useful radically polymerizable components include free-radical polymerizable monomers or oligomers that comprise addition polymerizable ethylenically unsaturated groups including multiple acrylate and methacrylate groups and combinations thereof, or free-radical crosslinkable polymers. More particularly useful radically polymerizable compounds include those derived from urea urethane (meth)acrylates or urethane (meth)acrylates having multiple polymerizable groups. For example, a most preferred radically polymerizable component can be prepared by reacting DESMODUR® N100 aliphatic polyisocyanate resin based on hexamethylene diisocyanate (Bayer Corp., Milford, Conn.) with hydroxy acrylate and pentaerythritol triacrylate. Other preferred radically polymerizable compounds are available from Sartomer Company, Inc. such as SR399 (dipentaerythritol pentaacrylate), SR355 (di-trimethylolpropane tetraacrylate), SR295 (pentaerythritol tetraacrylate), and others that would be readily apparent to one skilled in the art.

Numerous other radically polymerizable compounds are known to those skilled in the art and are described in considerable literature including *Photoreactive Polymers The Science and Technology of Resists*, A Reiser, Wiley, New York, 1989, pp. 102-177, by B. M. Monroe in *Radiation Curing: Science and Technology*, S. P. Pappas, Ed., Plenum, N.Y., 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful radically polymerizable components are also described in EP 1,182, 033A1 (noted above), beginning with paragraph [0170], all of which is incorporated herein by reference.

The radically polymerizable component is present in the radiation-sensitive composition in an amount sufficient to render the composition insoluble in an aqueous developer after exposure to radiation. For example, the weight ratio of radically polymerizable component to the polymeric binder (described below) is generally from about 5:95 to about 95:5, preferably from about 10:90 to about 90:10, and more preferably from about 30:70 to about 70:30.

The radiation-sensitive composition includes a borate initiator composition that is capable of generating radicals sufficient to initiate polymerization of the radically polymerizable component upon exposure of the composition to imaging radiation. The borate initiator composition may be responsive, for example, to electromagnetic radiation in the ultraviolet, visible and/or infrared spectral regions, corresponding to the spectral range of from about 150 to about 1500 nm. UV and visible light sensitivity is generally from about 150 to about 700 nm. Preferably, the initiator composition is responsive to infrared or near infrared radiation in the range of from about 600 to about 1300 nm, and more preferably to infrared radiation in the range of from about 700 to about 1200 nm.

Suitable borate initiator compositions include one or more boron components that generate free radicals including but not limited to, borate and organoborate salts such as those described in U.S. Pat. Nos. 6,562,543 (Ogata et al.) and 6,569,603 (noted above), both of which are incorporated herein by reference. Particularly useful boron components include organic boron salts that include an organic boron anion such as those described in the noted U.S. Pat. No. 6,569,603 that is paired with a suitable cation such as an alkali metal ion, an onium, or a cationic sensitizing dye. Useful onium cations include but are not limited to, ammonium, sulfonium, phosphonium, iodonium, and diazonium cations. The iodonium borate salts are most preferred and a representative compound is described in the Examples below. These compounds are either commercially available or prepared using known procedures.

The borate initiator composition including the boron compound is generally present in the radiation-sensitive composition in an amount of at least 1% and up to 30%, based on the total solids of the radiation-sensitive composition or the dry weight of the coated imageable layer. Preferably, the composition is present in an amount of from about 2% to about 15 weight %.

The polymeric binder useful in the radiation-sensitive composition comprises a polymer backbone to which is directly or indirectly attached a pendant group comprising a reactive vinyl group. The pendant group can be directly attached with a carbon-carbon direct bond, or through a linking group that is not particularly limited. The vinyl group may be substituted with at least one halogen atom, carboxy group, nitro group, cyano group, amide group, or alkyl, aryl, alkoxy, or aryloxy group. In preferred embodiments, the vinyl group is attached to the polymer backbone through a phenylene group as described, for example, in U.S. Pat. No. 6,569,603 (noted above) that is incorporated herein by reference. Other useful polymeric binders have vinyl groups in pendant groups that are described, for example in EP 1,182,033A1 (noted above) that is also incorporated by reference, especially with respect to the general formulae (1) through (3) noted therein.

Particularly useful polymeric binders are those represented by the following Structure (I):

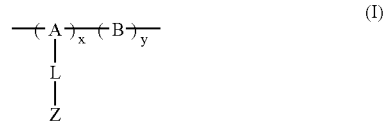

(I)

wherein A and B represent recurring units derived from different ethylenically unsaturated polymerizable monomers wherein the A recurring units comprise a pendant group having a reactive vinyl group and the B recurring units do not comprise reactive vinyl groups.

L is a carbon-carbon direct bond or a linking group that is chemically possible when joined with the "X" group shown in Structure IIa and IIb below (a skilled artisan would understand that certain "L" groups cannot be used with certain "X" groups). Such linking groups of L may be an oxy (—O—), thio (—S—), carbonyloxy [—C(O)O—], carbonamido [—C(O)NR'—], carbonyl [—C(O)—], amido (—NR'—), sulfonyl [—S(=O)$_2$O—], or alkylene group, or combinations of two or more of these groups. R' can be hydrogen, a substituted or unsubstituted alkyl group having 1 to 6 carbon atoms, or a substituted or unsubstituted aryl group having 6 or 10 carbon atoms in the ring. Preferably, L is a direct bond or a carbonyloxy group.

In Structure I, x is from about 1 to 100 mol % (preferably from about 5 to about 60 mol %), y is from 0 to about 99 mol % (preferably from about 40 to about 95 mol %).

Z is represented by the following Structure (IIa) or (IIb):

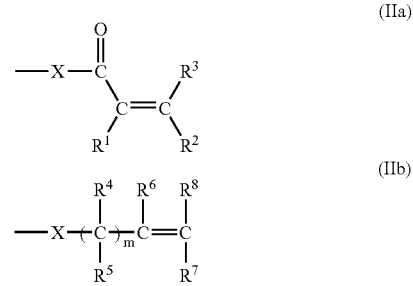

wherein X represents an oxy, thio, —NR$^9$—, or substituted or unsubstituted arylene group having 6 to 10 carbon atoms in the ring, such as substituted or unsubstituted phenylene. Preferably X is a substituted or unsubstituted phenylene group.

$R^1$ to $R^9$ independently represent monovalent organic groups of which there are hundreds of possibilities including but not limited to, hydrogen, substituted or unsubstituted alkyl groups having 1 to 10 carbon atoms, substituted or unsubstituted cycloalkyl groups having 5 to 10 carbon atoms in the unsaturated ring, substituted or unsubstituted aryl groups having 6 to 10 carbon atoms in the aromatic ring, substituted or unsubstituted heterocyclyl groups having 5 to 10 carbon, nitrogen, sulfur, or oxygen atoms in the aromatic or non-aromatic rings, cyano, halo, and vinyl groups.

Preferably, when the pendant groups comprise the moiety represented by Structure Ib, $R^4$ and $R^5$ are independently hydrogen or a substituted or unsubstituted alkyl group having 1 to 3 carbon atoms, and $R^6$ to $R^8$ are independently hydrogen, or a halo group, substituted or unsubstituted alkyl group having 1 to 6 carbon atoms, or a substituted or unsubstituted phenyl group. More preferably, $R^6$ to $R^8$ are independently hydrogen or a chloro, methyl, ethyl, or phenyl group In Structure IIb, m is 0 or 1, and preferably it is 0.

More preferably, Z is represented by Structure III:

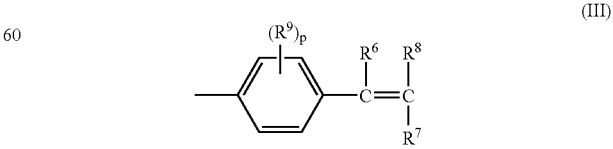

wherein $R^6$ through $R^8$ are as defined above, $R^9$ is a substitutable group or atom that would be readily apparent to one skilled in the art, and p is an integer of 0 to 4. Most preferably, p is 0, and $R^6$ through $R^8$ are each hydrogen.

The B recurring units shown in Structure I above can be derived from one or more of a variety of ethylenically unsaturated polymerizable monomers that include but are not limited to, (meth)acrylonitriles, (meth)acrylates, (meth)acrylic acids, vinyl carbazole, styrene and styrene derivatives, N-substituted maleimides, (meth)acrylamides, vinyl acetate, methyl vinyl ketone, vinyl triethoxysilane, and maleic anhydride. Particularly useful monomers from which B recurring units are derived include (meth)acrylonitriles, (meth)acrylates, (meth)acrylic acids, vinyl carbazole, and N-substituted maleimides.

The polymeric binders generally have a number average molecular weight ($M_n$) of from about 1,000 to about 1,000,000 and preferably from about 10,000 to about 500,000. They can be prepared using conventional free radical polymerization procedures as described for example in Chapters 20 and 21 of *Macromolecules*, Vol. 2, $2^{nd}$ Ed., H. G. Elias, Plenum, N.Y., 1984. Alternatively, the polymeric binders can be prepared by attaching the pendant reactive vinyl groups to suitable polymer backbones. A representative polymer synthesis for Polymer A is provided below before the Examples.

The polymeric binder described above is present in an amount of from about 10 to about 90%, and preferably from about 20 to about 80%, based on the total solids content of the radiation-sensitive composition, or the dry weight of the imageable layer prepared therefrom.

In some embodiments, it may be useful to incorporate a secondary polymeric binder such as those that are described fully in U.S. Pat. No. 6,899,994 (noted above) as having hydrophobic backbones and comprising both of the following a) and b) recurring units, or the b) recurring units alone:

a) recurring units having pendant cyano groups attached directly to the hydrophobic backbone, and b) recurring units having pendant groups comprising poly(alkylene oxide) segments.

Thus, the secondary polymeric binder comprises poly(alkylene oxide) segments and preferably poly(ethylene oxide) segments. These polymers can be graft copolymers having a main chain polymer and poly(alkylene oxide) side chains or block copolymers having blocks of (alkylene oxide)-containing recurring units and non(alkylene oxide)-containing recurring units. Both graft and block copolymers can additionally have pendant cyano groups attached directly to the hydrophobic backbone. The alkylene oxide constitutional units are generally $C_1$ to $C_6$ alkylene oxide groups, and more typically $C_1$ to $C_3$ alkylene oxide groups. The alkylene portions can be linear or branched or substituted versions thereof. Poly(ethylene oxide) and poly(propylene oxide) segments are preferred and poly(ethylene oxide) segments are most preferred.

In some embodiments, the secondary polymeric binders contain only recurring units comprising poly(alkylene oxide) segments, but in other embodiments, the polymeric binders comprise recurring units comprising the poly(alkylene oxide) segments as well as recurring units having pendant cyano groups attached directly to the hydrophobic backbone. By way of example only, such recurring units can comprise pendant groups comprising —CN, cyano-substituted or cyano-terminated alkylene groups. Recurring units can also be derived from ethylenically unsaturated polymerizable monomers such as acrylonitrile, methacrylonitrile, methyl cyanoacrylate, ethyl cyanoacrylate, or a combination thereof. However, cyano groups can be introduced into the polymer by other conventional means. Examples of such cyano-containing polymeric binders are described for example in U.S. Patent Application Publication 2005/003285 (Hayashi et al.) that is incorporated herein by reference.

By way of example, the secondary polymeric binder can be formed by polymerization of a combination or mixture of suitable ethylenically unsaturated polymerizable monomers or macromers, such as:

A) acrylonitrile, methacrylonitrile, or a combination thereof,

B) poly(alkylene oxide) esters of acrylic acid or methacrylic acid, such as poly(ethylene glycol) methyl ether acrylate, poly(ethylene glycol) methyl ester methacrylate, or a combination thereof, and C) optionally, monomers such as acrylic acid, methacrylic acid, styrene, hydroxystyrene, acrylate esters, methacrylate esters, acrylamide, methacrylamide, or a combination of such monomers.

The amount of the poly(alkylene oxide) segments in the secondary polymeric binders is from about 0.5 to about 60 weight %, preferably from about 2 to about 50 weight %, more preferably from about 5 to about 40 weight %, and most preferably from 5 to 20 weight %. The amount of (alkylene oxide) segments in the block copolymers is generally from about 5 to about 60 weight %, preferably from about 10 to about 50 weight %, and more preferably from about 10 to about 30 weight %.

Other useful secondary polymeric binders include acrylic-urethane hybrid polymers that are commercially available in dispersions from Air Products and Chemicals, Inc. (Allentown, Pa.) under the tradename Hybridur, for example, the Hybridur 540, 560, 570, 580, 870, and 878 acrylic-urethane hybrid dispersions.

The secondary polymeric binder may be present in the radiation-sensitive composition in an amount of from about 5 to about 40 weight % based on the total solids content of the composition, or the dry coated weight of the imageable layer.

The radiation-sensitive compositions also include a radiation absorbing compound (sometimes called a "sensitizer") that is sensitive to radiation at a desired wavelength. These compounds absorb the radiation and facilitate polymerization during imaging. The radiation absorbing compounds can be sensitive to radiation having a wavelength of from about 150 to about 1400 nm.

The compounds sensitive to UV and visible radiation generally have a $\lambda_{max}$ of from about 150 to about 600 nm, and preferably from about 200 to about 550 nm n.

Preferably, the radiation absorbing compounds are sensitive to infrared and near-infrared radiation, that is, from about 600 to about 1400 nm and preferably from about 700 to about 1200 nm. Such radiation absorbing compounds include carbon blacks and other IR-absorbing pigments and various IR-sensitive dyes ("IR dyes").

Examples of suitable IR dyes include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.) that is incorporated herein by reference.

A general description of one class of suitable cyanine dyes is shown by the formula in paragraph [0026] of WO 2004/101280, incorporated herein by reference, and two specific examples of useful IR absorbing compounds are identified below with the Examples as IR Dyes 1 and 2.

In addition to low molecular weight IR-absorbing dyes, IR dye moieties bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. Nos. 6,309,792 (Hauck et al.), 6,264,920 (Achilefu et al.), 6,153,356 (Urano et al.), 5,496,903 (Watanate et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (DeBoer).

Useful IR absorbing compounds include carbon blacks including carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful.

The radiation absorbing compound can be present in the radiation-sensitive composition in an amount generally of at least 0.1% and up to 20% and preferably from about 0.05 to about 5%, based on total solids in the composition, that also corresponds to the total dry weight of the imageable layer. Alternatively, the amount can be defined by an absorbance in the range of from about 0.05 to about 3, and preferably from about 0.1 to about 1.5, in the dry film as measured by reflectance UV-visible spectrophotometry. The particular amount needed for this purpose would be readily apparent to one skilled in the art, depending upon the specific compound used.

The radiation-sensitive composition includes a "primary additive" that is a poly(alkylene glycol) or an ether or ester thereof that has a molecular weight of from about 200 and up to 4000 (preferably from about 500 to about 2000). This primary additive is present in an amount of from about 2 to about 50 weight % (preferably from about 5 to about 30%) based on the total solids content of the composition, or the total dry weight of the imageable layer.

Particularly useful primary additives include, but are not limited to, one or more of polyethylene glycol, polypropylene glycol, polyethylene glycol methyl ether, polyethylene glycol dimethyl ether, polyethylene glycol monoethyl ether, polyethylene glycol diacrylate, ethoxylated bisphenol A di(meth)acrylate, and polyethylene glycol mono methacrylate. Also useful are SR9036 (ethoxylated (30) bisphenol A dimethacrylate), CD9038 (ethoxylated (30) bisphenol A diacrylate), and SR494 (ethoxylated (5) pentaerythritol tetraacrylate), and similar compounds all of which that can be obtained from Sartomer Company, Inc. In some embodiments, the primary additive may be "non-reactive" meaning that it does not contain polymerizable vinyl groups.

The radiation-sensitive composition can also include a secondary additive that is a poly(vinyl alcohol), a poly(vinyl pyrrolidone), poly(vinyl imidazole), or polyester in an amount of up to and including 20 weight % based on the total solids content of the composition, or the total dry weight of the imageable layer.

The radiation-sensitive composition can also include a variety of optional compounds including but not limited to, dispersing agents, humectants, biocides, plasticizers, surfactants for coatability or other properties, viscosity builders, dyes or colorants to allow visualization of the written image, pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly(vinyl pyrrolidones).

In some embodiments, the radiation-sensitive composition also includes a mercaptan derivative such as a mercaptotriazole such as 3-mercapto-1,2,4-triazole, 4-methyl-3-mercapto-1,2,4-triazole, 5-mercapto-1-phenyl-1,2,4-triazole, 4-amino-3-mercapto-1,2,4-triazole, 3-mercapto-1,5-diphenyl-1,2,4-triazole, and 5-(p-aminophenyl)-3-mercapto-1,2,4-triazole. Various mercaptobenzimidazoles, mercaptobenzthiazoles, and mercaptobenzoxazoles may also be present.

Imageable Elements

The imageable elements are formed by suitable application of a radiation-sensitive composition as described above to a suitable substrate to form an imageable layer. This substrate is usually treated or coated in various ways as described below prior to application of the radiation-sensitive composition. Preferably, there is only a single imageable layer comprising the radiation-sensitive composition of this invention. If the substrate has been treated to provide an "interlayer" for improved adhesion or hydrophilicity, the applied radiation-sensitive composition is considered the "top" or outermost layer. There is no need to apply what is conventionally known as an overcoat (such as an oxygen impermeable topcoat) to the imageable layer(s).

The substrate generally has a hydrophilic surface, or at least a surface that is more hydrophilic than the applied radiation-sensitive composition on the imaging side. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both flat surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A preferred substrate is composed of an aluminum support that may be treated using techniques known in the art, including physical graining, electrochemical graining, chemical graining, and anodizing. Preferably, the aluminum sheet is anodized using phosphoric acid or sulfuric acid and conventional procedures.

An interlayer may be formed by treatment of the aluminum support with, for example, a silicate, dextrine, calcium zirconium fluoride, hexafluorosilicic acid, phosphate/fluoride, poly(vinyl phosphonic acid) (PVPA), vinyl phosphonic acid copolymer, poly(acrylic acid), or acrylic acid copolymer. Preferably, the aluminum support is mechanically-grained, phosphoric acid-anodized, and treated with poly(acrylic acid) using known procedures to improve surface hydrophilicity.

The thickness of the substrate can be varied but should be sufficient to sustain the wear from printing and thin enough to wrap around a printing form. Preferred embodiments include a treated aluminum foil having a thickness of from about 100 to about 600 μm.

The backside (non-imaging side) of the substrate may be coated with antistatic agents and/or slipping layers or a matte layer to improve handling and "feel" of the imageable element.

The substrate can also be a cylindrical surface having the radiation-sensitive composition applied thereon, and thus be an integral part of the printing press. The use of such imaging cylinders is described for example in U.S. Pat. No. 5,713,287 (Gelbart).

The radiation-sensitive composition can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder). Preferably, the radiation-sensitive composition is applied as the outermost layer.

Illustrative of such methods is mixing the radically polymerizable component, borate initiator composition, radiation absorbing compound, polymeric binder, primary additive, and any other components of the radiation-sensitive composition in a suitable organic solvent [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Preferred coating solvents and representative imageable layer formulations are described in the Examples below. After proper drying, the coating weight of the imageable layer is generally from about 0.1 to about 5 g/m$^2$, preferably from about 0.5 to about 3.5 g/m$^2$, and more preferably from about 0.5 to about 1.5 g/m$^2$.

Layers can also be present under the imageable layer to enhance developability or to act as a thermal insulating layer. The underlying layer should be soluble or at least dispersible in the developer and preferably have a relatively low thermal conductivity coefficient.

The imageable elements have any useful form including, but not limited to, printing plate precursors, printing cylinders, printing sleeves and printing tapes (including flexible printing webs). Preferably, the imageable members are printing plate precursors.

Printing plate precursors can be of any useful size and shape (for example, square or rectangular) having the requisite imageable layer disposed on a suitable substrate. Printing cylinders and sleeves are known as rotary printing members having the substrate and imageable layer in a cylindrical form. Hollow or solid metal cores can be used as substrates for printing sleeves.

Imaging Conditions

During use, the imageable element is exposed to a suitable source of radiation such as UV, visible light, near-infrared, or infrared radiation, depending upon the radiation absorbing compound present in the radiation-sensitive composition, at a wavelength of from about 150 to about 1400 nm. Preferably, imaging is carried out using an infrared laser at a wavelength of from about 700 to about 1200 nm. The laser used to expose the imageable element is preferably a diode laser, because of the reliability and low maintenance of diode laser systems, but other lasers such as gas or solid state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1060 to about 1120 nm.

The imaging apparatus can function solely as a platesetter or it can be incorporated directly into a lithographic printing press. In the latter case, printing may commence immediately after imaging and development, thereby reducing press set-up time considerably. The imaging apparatus can be configured as a flatbed recorder or as a drum recorder, with the imageable member mounted to the interior or exterior cylindrical surface of the drum. An example of an useful imaging apparatus is available as models of Creo Trendsetter® imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Advantageously, imaging can be carried out at relatively lower imaging energies, for example as low as 30 mJ/cm$^2$ and up to and including 500 mJ/cm$^2$, preferably from about 30 to about 250 mJ/cm$^2$, and more preferably from about 30 to about 180 mJ/cm$^2$.

While laser imaging is preferred in the practice of this invention, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH7-1089).

Without the need for a pre-heat step after imaging, the imaged elements are developed using conventional processing and a conventional aqueous alkaline or organic alkaline developer. The developer composition commonly includes surfactants, chelating agents (such as salts of ethylenediaminetetraacetic acid), organic solvents (such as benzoyl alcohol), and alkaline components (such as inorganic metasilicates, organic metasilicates, hydroxides, and bicarbonates). The pH of the alkaline developer is preferably from about 8 to about 14.

The imaged elements are generally developed using conventional processing conditions. Both aqueous alkaline developers and solvent-based alkaline developers can be used with the latter type of alkaline developers being preferred.

Aqueous alkaline developers generally have a pH of at least 7 and preferably of at least 11. The higher pH developers are generally best for processing the single-layer elements. Useful alkaline aqueous developers include 3000 Developer, 9000 Developer, GOLDSTAR Developer, GREENSTAR Developer, ThermalPro Developer, PROTHERM Developer, MX1813 Developer, and MX1710 Developer (all available from Kodak Polychrome Graphics, a subsidiary of Eastman Kodak Company). These compositions also generally include surfactants, chelating agents (such as salts of ethylenediaminetetraacetic acid), and alkaline components (such as inorganic metasilicates, organic metasilicates, hydroxides, and bicarbonates).

Solvent-based alkaline developers are generally single-phase solutions of one or more organic solvents that are miscible with water. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 to about 15% based on total developer weight.

Representative solvent-based alkaline developers include ND-1 Developer, 955 Developer, Developer 980, and 956 Developer (available from Kodak Polychrome Graphics a subsidiary of Eastman Kodak Company).

Generally, the alkaline developer is applied to the imaged element by rubbing or wiping the outer layer with an applicator containing the developer. Alternatively, the imaged element can be brushed with the developer or the developer may be applied by spraying the outer layer with sufficient force to remove the exposed regions. Still again, the imaged element can be immersed in the developer. In all instances, a developed image is produced in a lithographic printing plate having excellent resistance to press room chemicals.

Following development, the imaged element can be rinsed with water and dried in a suitable fashion. The dried element can also be treated with a conventional gumming solution (preferably gum arabic). In addition, a postbake operation can be carried out.

Printing can be carried out by applying a lithographic ink and fountain solution to the printing surface of the imaged and developed element. The fountain solution is taken up by the non-imaged regions, that is, the surface of the hydrophilic substrate revealed by the imaging and development steps, and the ink is taken up by the imaged (non-removed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means.

The following examples are provided to illustrate the practice of the invention but are by no means intended to limit the invention in any manner.

EXAMPLES

The components and materials used in the examples and analytical methods used in evaluation were as follows:

Byk® 307 is a polyethoxylated dimethyl polysiloxane copolymer that is available from Byk Chemie (Wallingford, Conn.) in a 25 wt. % xylene/methoxypropyl acetate solution.

UR3447 is a urethane acrylate that was prepared by reacting 1-methyl-2,4-bis-isocyanate benzene with hydroxyethyl acrylate and pentaerythritol triacrylate.

Initiator 1 is 4-methylphenyl-4'-isobutylphenyl iodonium tetraphenylborate.

D11 dye is ethanaminium, N-[4-[[4-(diethylamino)phenyl][4-(ethylamino)-1-naphthalenyl]methylene]-2,5-cyclohexadien-1-ylidene]-N-ethyl-, salt with 5-benzoyl-4-hydroxy-2-methoxybenzenesulfonic acid (1:1) as supplied by PCAS (Longjumeau, France).

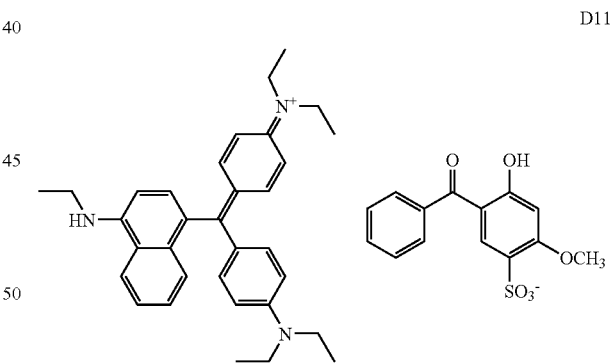

D11

Irgacure® 250 is a 75 wt. % solution of iodonium, (4-methoxyphenyl)[4-(2-methylpropyl)phenyl]-, hexafluorophosphate in propylene carbonate that was obtained from Ciba Specialty Chemicals (Tarrytown, N.Y.).

Irganox 1035 is thiodiethylene bis(3,5-di-tert-butyl-4-hydroxyhydrocinnamate) and was obtained from Ciba Specialty Chemicals Company.

SR399 (Dipentaerythritol pentaacrylate) was obtained from Sartomer Company, Inc. (Exton, Pa.).

Hybridur 580 is an anionic stabilized urethane-acrylic hybrid polymer dispersion that was obtained from Air Product & Chemicals, Inc. (Allentown, Pa.).

IR Dye 1 was obtained from Showa Denko (Japan) and is represented by the following formula:

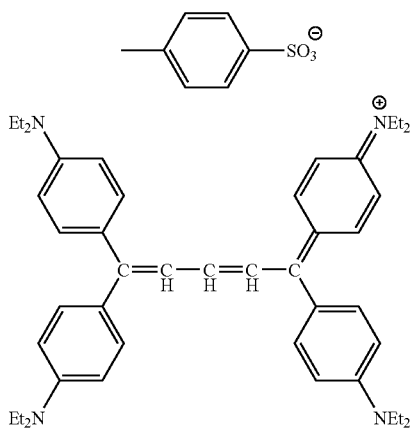

IR Dye 2 was obtained from Eastman Kodak Company and is represented by the following formula:

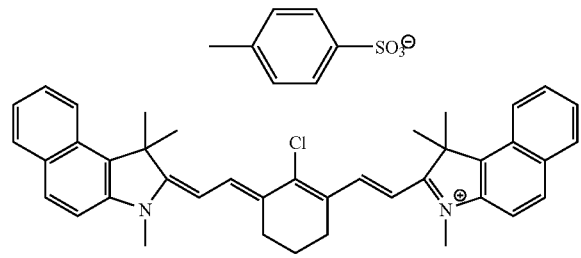

Pigment 951 contained 409.5 g of PGME, 13.5 g of T-76 binder, 135 g of Irgalith Blue GLVO (Cu-phthalocyanine C.I. Pigment Blue 15:4), and 27 g of Disperbyk® 167 dispersant (Byk Chemie).

956 Developer is a solvent based (phenoxyethanol) alkaline negative developer (Kodak Polychrome Graphics, a subsidiary of Eastman Kodak Company, Norwalk, Conn., USA).

ND-1 develop is a solvent based (benzyl alcohol) alkaline negative developer (Kodak Polychrome Graphics, a subsidiary of Eastman Kodak Company, Gunma, Japan).

PGME is 1-methoxy-2-propanol that is also known as Dowanol PM.

MEK is methyl ethyl ketone.

BLO is γ-butyrolactone.

Synthesis of Binder Polymer A

AIBN (2,2'-azobis(isobutyronitrile), 1.6 g), methyl methacrylate (20 g), acrylonitrile (24 g), N-vinyl carbazole (20 g), methacrylic acid (16 g), and N,N'-dimethylacetamide (DMAC, 320 g) were placed in a 1000-ml 3-necked flask, equipped with magnetic stirring, temperature controller, and $N_2$ inlet. The reaction mixture was heated to 60° C. and stirred under $N_2$ protection overnight (about 16 hours). The % N.V. was measured with 20.6%.

To this reaction mixture (after nitrogen protection was removed), 5.2 g of KOH in 40 g of water was slowly added and a viscous liquid was formed. After stirring the mixture for 10 minutes, 14.0 g of vinyl benzyl chloride was added and the mixture was stirred at 55° C. for 3 hours. Concentrated (36%) hydrochloric acid (12 g) in 40 g of DMAC was added to the flask and the reaction mixture was stirred for another 5 hours. The resulting reaction mixture was then slowly dropped into a mixture of 12-liters of ice water with 20 g of concentrated hydrochloric acid while stirring. The resulting precipitate was filtered and washed with 2000 ml of propanol, followed by washing with 2000 ml of water. A fine white powder was obtained after filtration. The powder was dried at room temperature overnight and then at 50° C. for 3 hours to obtain 84 g of polymer solid.

Polymer B was prepared similarly to Polymer A with 40 wt. % acrylonitrile, 40 wt. % methyl methacrylate, 10 wt. % methacrylic acid, and 10 wt. % vinylbenzyl methacrylate.

Polymer C was prepared similarly to Polymer A with 20 wt. % acrylonitrile, 50 wt. % methyl methacrylate, 10 wt. % vinyl carbazole, 10 wt. % methacrylic acid, and 10 wt. % vinylbenzyl methacrylate.

Example 1

Preparation of Imageable Element Using Polymer A

A negative-working, radiation-sensitive composition of this invention was prepared by dissolving 1.95 g of Polymer A, 1.83 g of UR3447, 0.44 g of Initiator 1, 0.16 g of IR Dye 1, 0.10 g of 3-mercaptotriazole, 0.59 g of Pigment 951, 1.08 g of polyethylene glycol methyl ether (MW=750, Aldrich Chemical Co.), and 0.54 g of 10% Byk 307 in 66.5 g of PGME, 23.6 g of MEK, and 4.8 g of BLO. A mechanically-grained and phosphoric acid anodized aluminum substrate, that had been post-treated with poly(acrylic acid), was coated with the noted imaging composition, resulting in an imageable layer having a dry coating weight of about 1.3 $g/m^2$ when dried at 170° F. (77° C.) for about 2 minutes on a rotating drum.

The resulting negative-working printing plate precursor was placed on a CREO Trendsetter 3244× imagesetter (available from Creo, a subsidiary of Eastman Kodak Company, Burnaby, British Columbia, Canada) and exposed to an 830 nm IR laser at an energy of about 120 $mJ/cm^2$. Without a preheat step, the imaged element was then developed in an Anitec Duplex 16 processor charged with ND-1 developer at 25° C. The printing plate was mounted on a Miehle sheet-fed press using ink containing 1.5% calcium carbonate and used to produce at least 20,000 good impressions.

Example 2

Preparation of Imageable Element Using Polymer B

A negative-working, radiation-sensitive composition of this invention was prepared by dissolving 1.95 g of Polymer B, 1.83 g of UR3447, 0.44 g of Initiator 1, 0.16 g of IR Dye 1, 0.10 g of 3-mercaptotriazole, 0.08 g of D11, 1.08 g of polyethylene glycol methyl ether (MW=750, Aldrich Chemical Co.), and 0.54 g of 10% Byk® 307 in 66.5 g of PGME, 23.6 g of MEK, and 4.8 g of BLO. The imaging composition was applied to the same substrate and dried as described in Example 1 to provide an imageable layer having a dry coating weight of about 1.3 $g/m^2$.

The resulting negative-working printing plate precursor was placed on a CREO Trendsetter 3244× imagesetter and exposed to an 830 nm IR laser at an energy of about 150 $mJ/cm^2$. Without a preheat step, the imaged element was then developed in an Anitec Duplex 16 processor charged with ND-1 developer at 25° C. The developed plate was mounted on a Miehle sheet-fed press using ink containing 1.5% calcium carbonate and used to produce at least 20,000 good impressions.

Example 3

Preparation of Imageable Element with Polymer C

A negative-working, radiation-sensitive composition of this invention was prepared by dissolving 1.95 g of Polymer C, 1.83 g of UR3447, 0.18 g of sodium tetraphenylborate, 0.25 g of Irgacure 250, 0.16 g of IR Dye 1, 0.10 g of 3-mercaptotriazole, 0.08 g of D11, 1.08 g of polyethylene glycol methyl ether (MW=750, Aldrich Chemical Co.), and 0.54 g of 10% Byk® 307 in 66.5 g of PGME, 23.6 g of MEK, and 4.8 g of BLO. The imaging composition was applied to the same substrate and dried as described in Example 1 to provide an imageable layer having a dry coating weight of about 1.3 g/m².

The resulting printing plate precursor was placed on a CREO Trendsetter 3244x imagesetter and exposed to an 830 nm IR laser at an energy of about 150 mJ/cm². Without a preheat step, the imaged element was then developed in an Anitec Duplex 16 processor charged with ND-1 developer (Kodak Polychrome Graphics, Japan) at 25° C. The developed printing plate was mounted on a Miehle sheet-fed press using ink containing 1.5% calcium carbonate and used to produce at least 20,000 good impressions.

Example 4

Use of Various Primary Additives

Negative-working, radiation-sensitive compositions of this invention were prepared by dissolving 0.30 g of Polymer B, 0.28 g of UR3447, 0.03 g of sodium tetraphenylborate, 0.06 g of Irgacure 250, 0.01 g of IR Dye 1, 0.02 g of 3-mercaptotriazole, 0.01 g of D11, a variable amount of several primary additives shown below in TABLE 1 and 0.08 g of 10% Byk® 307 in 9.96 g of PGME, 3.53 g of MEK, and 0.72 g of BLO. Each imaging composition was individually coated onto the same substrate as described in Example 1 using a wire-wound rod and then dried for approximately 90 seconds residence time in a Ranar conveyor oven set at 90° C. to provide an imageable layer on the substrate. A Control imaging composition and printing plate precursor was prepared without a primary additive.

The resulting negative-working printing plate precursors were placed on a CREO Trendsetter 3244x imagesetter and exposed to an 830 nm IR laser at an energy ranging from 60 to 170 mJ/cm². Without a preheat step, the imaged elements were then developed with ND-1 developer in a tray at 25° C. The minimum energy needed to achieve a maximum image density ("Max. Den.") is given in the following TABLE I. No image was observed without the presence of the primary additive in the imaging composition.

TABLE I

| Sample | Primary additive | Primary Additive Mol. Wt. | Primary Additive (g) | Max. Den. (mJ/cm²) |
|---|---|---|---|---|
| 1 (Control) | None | N/A | N/A | No image up to 170 mJ/cm² |
| 2 | Poly(ethylene glycol) | 200 | 0.2 | 120 |
| 3 | Poly(ethylene glycol) | 400 | 0.1 | 120 |
| 4 | Poly(ethylene glycol) | 400 | 0.2 | 120 |
| 5 | Poly(ethylene glycol) | 400 | 0.3 | 120 |
| 6 | Poly(ethylene glycol) methyl ether | 750 | 0.1 | 100 |
| 7 | Poly(ethylene glycol) methyl ether | 750 | 0.15 | 80 |
| 8 | Poly(ethylene glycol) methyl ether | 750 | 0.2 | 90 |
| 9 | Poly(ethylene glycol) methyl ether | 750 | 0.3 | 120 |
| 10 | Poly(ethylene glycol) methyl ether | 750 | 0.4 | 130 |
| 11 | Poly(ethylene glycol) | 1,000 | 0.1 | 120 |
| 12 | Poly(ethylene glycol) | 1,000 | 0.2 | 80 |
| 13 | Poly(ethylene glycol) | 1,000 | 0.3 | 120 |
| 14 | Poly(ethylene glycol) dimethyl ether | 2,000 | 0.1 | 110 |
| 15 | Poly(ethylene glycol) dimethyl ether | 2,000 | 0.2 | 110 |
| 16 | Poly(ethylene glycol) dimethyl ether | 2,000 | 0.3 | 120 |
| 17 | Poly(propylene glycol) | 1,000 | 0.2 | 120 |
| 18 | Poly(ethylene glycol) dimethacrylate | 330 | 0.2 | 80 |
| 19 | Poly(ethylene glycol) dimethacrylate | 875 | 0.2 | 80 |
| 20 | Poly(ethylene glycol) diacrylate | 700 | 0.2 | 70 |

These results show that adding a primary additive dramatically increases digital speed of the radiation-sensitive composition and imageable elements of this invention.

Example 5

A negative-working, radiation-sensitive composition of this invention was prepared by dissolving 2.05 g of Polymer A, 1.45 g of UR3447, 0.39 g of Initiator 1, 0.17 g of IR Dye 1, 0.11 g of Irganox 1035, 1.11 g of SR399, 0.60 g of pigment 951, 0.55 g of polyethylene glycol diacrylate (MW=700, Aldrich), and 0.55 g of 10% Byk® 307 in 60.5 g of PGME and 30.5 g of MEK. A mechanically-grained and phosphoric acid anodized aluminum substrate that had been post-treated with poly(acrylic acid) was coated with the composition to provide a dry coating weight of about 1.3 g/m² when properly dried at 170° F. for about 2 minutes on a rotating drum.

The resulting imageable element was placed on a CREO Trendsetter 3244x image setter and exposed to 830 nm IR laser at an energy ranging from 50 to 210 mJ/cm². The imaged elements were then developed using a SWORD Excel NE34 plate processor charged with 956 Developer at 25° C. The minimum energy necessary to achieve a solid image was about 90 mJ/cm². After the printing plates prepared from the same composition and conditions were incubated individually at 50° C. and at 38° C. plus 80% humidity for 5 days, they performed as well as the fresh printing plates in terms of digital speed and developability.

Example 6

A negative-working, radiation-sensitive composition of this invention was prepared by dissolving 8.25 g of Hybridur 580, 0.58 g of Initiator 1, 0.25 g of IR Dye 1, 3.82 g of SR399, 0.75 g of pigment 951, 0.83 g of polyethylene glycol diacrylate (MW=700, Aldrich), and 0.41 g of 10% Byk® 307 in 93.9 g of PGME and 41.2 g of MEK. An mechanically-grained and phosphoric acid anodized aluminum substrate that had been post-treated with poly(acrylic acid) was coated with this composition to provide a dry coating weight of about 1.3 g/m² when properly dried at 170° F. for about 2 minutes on a rotating drum. The resulting imageable element was placed on a CREO Trendsetter 3244× image setter and exposed to 830 nm IR laser range from 50 to 210 mJ/cm². The imaged element was then developed using a SWORD Excel NE34 plate processor charged with 956 Developer at 25° C. The minimum energy necessary to achieve a solid image was about 60 mJ/cm².

The invention has been described in detail with particular reference to certain preferred embodiments thereof, but it will be understood that variations and modifications can be effected within the spirit and scope of the invention.

The invention claimed is:

1. A radiation-sensitive composition comprising:
a radically polymerizable component,
a borate initiator composition capable of generating radicals sufficient to initiate polymerization of said radically polymerizable component upon exposure to imaging radiation,
a radiation absorbing compound,
a polymeric binder comprising a polymer backbone to which is directly or indirectly linked a pendant group comprising a reactive vinyl group, and
a primary additive that is a poly(alkylene glycol) or an ether or ester thereof that has a number average molecular weight of from about 200 and up to 4000 and comprises from about 2 to about 50 weight % of said composition based on the total composition solids content.

2. The composition of claim 1 wherein said primary additive has a number average molecular weight of from about 500 to about 2000 and is present in an amount of from about 5 to about 30 weight % of said composition based on the total composition solids content.

3. The composition of claim 1 wherein said primary additive comprises one or more of polyethylene glycol, polypropylene glycol, polyethylene glycol methyl ether, polyethylene glycol dimethyl ether, polyethylene glycol monoethyl ether, polyethylene glycol diacrylate, ethoxylated bisphenol A di(meth)acrylate, and polyethylene glycol mono methacrylate.

4. The composition of claim 3 further comprising a secondary additive that is a poly(vinyl alcohol), a poly(vinyl pyrrolidone), poly(vinyl imidazole), or polyester and is present in an amount of up to and including 20 weight % based on the total solids content of said composition.

5. The composition of claim 1 wherein said borate initiator composition comprises an iodonium borate salt.

6. The composition of claim 1 wherein said radically polymerizable component is an unsaturated free-radical polymerizable monomer or oligomers or a free-radical crosslinkable polymer and does not contain a poly(alkylene glycol).

7. The composition of claim 1 wherein said polymeric binder is represented by the following Structure (I):

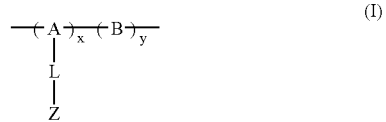

wherein A and B represent recurring units derived from different ethylenically unsaturated polymerizable monomers wherein the A recurring units comprise a pendant group having a reactive vinyl group and the B recurring units do not comprise reactive vinyl groups, L is a carbon-carbon direct bond or a linking group, x is from about 1 to 100 mol %, y is from 0 to about 99 mol %, and Z is a pendant group represented by the following Structure (IIa) or (IIb):

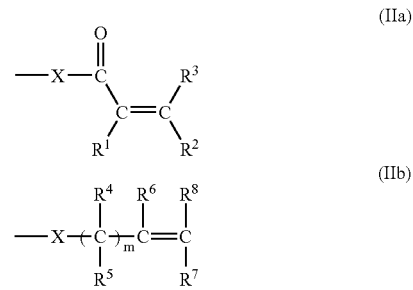

wherein X represents an oxy, thio, —NR⁹—, or arylene group, R¹ to R⁹ independently represent monovalent organic groups, and m is 0 or 1.

8. The composition of claim 7 wherein L is an oxy (—O—), thio (—S—), carbonyloxy [—C(O)O—], carbonamido [—C(O)NR'—], carbonyl [—C(O)—], amido (—NR'—), sulfonyl [—S(=O)₂O—], or alkylene group, or combinations of two or more of these groups, R' is hydrogen or an alkyl or aryl group.

9. The composition of claim 7 wherein said Z pendant groups comprise the moiety represented by Structure (IIb) wherein m is 0, X is a phenylene group, R⁴ and R⁵ are independently hydrogen or an alkyl group having 1 to 3 carbon atoms, and R⁶ to R⁸ are independently hydrogen or a halo group, an alkyl group having 1 to 6 carbon atoms, or a phenyl group.

10. The composition of claim 9 wherein m is O and R⁶ to R⁸ are independently hydrogen or a chloro, methyl, ethyl, or phenyl group.

11. The composition of claim 7 wherein said Z pendant group is represented by the following Structure (III):

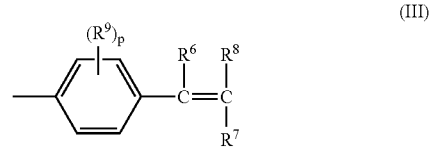

wherein R⁹ is a substitutable group or atom and p is an integer of 0 to 4.

12. The composition of claim 11 wherein p is 0 and R⁶ through R⁸ are each hydrogen.

13. An imageable element comprising a substrate having thereon an imageable layer comprising:
a radically polymerizable component,
a borate initiator composition capable of generating radicals sufficient to initiate polymerization of said radically polymerizable component upon exposure to imaging radiation,
a radiation absorbing compound,
a polymeric binder comprising a polymer backbone to which is directly or indirectly linked a pendant group comprising a reactive vinyl group, and a primary additive that is a poly(alkylene glycol) or an ether or ester thereof that has a number average molecular weight of from about 200 and up to 4000 and comprises from about 2 to about 50 weight % based on the total dry weight of said imageable layer.

14. The imageable element of claim 13 wherein said imageable layer is the outermost coated layer, said radiation absorbing compound is a carbon black or an IR-sensitive dye, and said primary additive has a number average molecular weight of from about 500 to about 2000 and is present in an amount of from about 5 to about 30 weight % based on the total dry weight of said imageable layer.

15. The imageable element of claim 13 wherein said primary additive comprises one or more of polyethylene glycol, polypropylene glycol, polyethylene glycol methyl ether, polyethylene glycol dimethyl ether, polyethylene glycol monoethyl ether, polyethylene glycol diacrylate, and polyethylene glycol mono methacrylate, and said composition optionally further comprises a secondary additive that is a poly(vinyl alcohol), a poly(vinyl pyrrolidone), poly(vinyl imidazole), or polyester that is present in an amount of up to and including 20 weight % based on the total dry weight of said imageable layer.

16. The imageable element of claim 13 wherein said borate initiator composition comprises a borate iodonium salt, and said radically polymerizable component is an unsaturated free-radical polymerizable monomer or oligomer or a free-radical crosslinkable polymer.

17. The imageable element of claim 11 wherein said polymeric binder is represented by the following Structure (I):

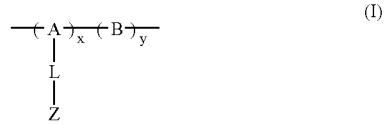

wherein A and B represent recurring units derived from different ethylenically unsaturated polymerizable monomers wherein the A recurring units comprise a pendant group having a reactive vinyl group and the B recurring units do not comprise reactive vinyl groups, L is a carbon-carbon direct bond or a linking group, x is from about 1 to 100 mol %, y is from 0 to about 99 mol %, and Z is a pendant group represented by the following Structure (IIa) or (IIb):

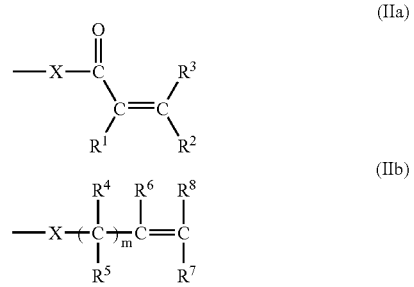

wherein X represents an oxy, thio, $-NR^9-$, or arylene group, $R^1$ to $R^9$ independently represent monovalent organic groups, and m is 0 or 1.

18. The imageable element of claim 17 said pendant groups comprise the moiety represented by Structure (Ib) wherein m is 0, X is a phenylene group, $R^4$ and $R^5$ are independently hydrogen or an alkyl group having 1 to 3 carbon atoms, and $R^6$ to $R^8$ are independently hydrogen or a halo group, an alkyl group having 1 to 6 carbon atoms, or a phenyl group.

19. The imageable element of claim 17 wherein said Z pendant group is represented by the following Structure (III):

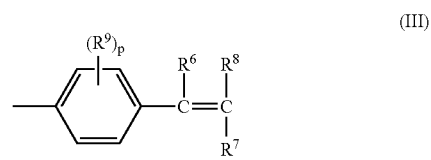

wherein $R^9$ is a substitutable group or atom and p is an integer of 0 to 4.

20. A method of making a negative-working printing plate comprising:

A) imagewise exposing an imageable element comprising a substrate having thereon an imageable layer comprising:
    a radically polymerizable component,
    a borate initiator composition capable of generating radicals sufficient to initiate polymerization of said radically polymerizable component upon exposure to imaging radiation,
    a radiation absorbing compound,
    a polymeric binder comprising a polymer backbone to which is directly or indirectly linked a pendant group comprising a reactive vinyl group, and
    a primary additive that is a poly(alkylene glycol) or an ether or ester thereof that has a number average molecular weight of from about 200 and up to 4000 and comprises from about 2 to about 50 weight % based on the total dry weight of said imageable layer, and B) without a preheat step, developing said imagewise exposed element to remove only non-exposed regions of said imageable layer.

21. The method of claim 20 wherein the imagewise exposure step A is carried out using an exposure energy of from about 30 to about 500 mJ/cm$^2$.

22. The method of claim 20 wherein said radiation absorbing compound is carbon black or an IR-sensitive dye and said imagewise exposing step A is carried out using radiation having a maximum wavelength of from about 700 to about 1200 nm at an energy level of from about 30 to about 250 mJ/cm$^2$.

23. An imaged element obtained from the method of claim 20.

* * * * *